(12) United States Patent
Yamaoka

(10) Patent No.: US 7,767,953 B2
(45) Date of Patent: Aug. 3, 2010

(54) VOLTAGE GENERATOR, ANALOG-TO-DIGITAL CONVERTER, AND IMAGE SENSOR SYSTEM

(75) Inventor: Yuusuke Yamaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 96 days.

(21) Appl. No.: 12/114,310

(22) Filed: May 2, 2008

(65) Prior Publication Data

US 2008/0296473 A1 Dec. 4, 2008

(30) Foreign Application Priority Data

Jun. 1, 2007 (JP) ............................. 2007-146862

(51) Int. Cl.
*H01J 40/14* (2006.01)
*H03M 1/78* (2006.01)

(52) U.S. Cl. ............................. 250/214 R; 250/214 LS; 250/214 SW; 341/154

(58) Field of Classification Search ............. 250/214 R, 250/214 LS, 214 DC, 214 SW, 214 C; 327/131, 327/134–135, 170, 530; 341/110, 122, 154, 341/155

See application file for complete search history.

(56) References Cited

U.S. PATENT DOCUMENTS

| 6,956,413 | B2 | 10/2005 | Bailey |
| 7,151,472 | B2 | 12/2006 | Huang et al. |
| 7,271,755 | B2 * | 9/2007 | Mulder et al. ............... 341/154 |

FOREIGN PATENT DOCUMENTS

| JP | 09-325822 | 12/1997 |
| JP | 3611672 | 1/2005 |

\* cited by examiner

*Primary Examiner*—Kevin Pyo
(74) *Attorney, Agent, or Firm*—McDermott Will & Emery LLP

(57) ABSTRACT

A ladder resistor circuit generates a plurality of different reference voltages. A plurality of switching circuits correspond to a plurality of taps of the ladder resistor circuit. Each of the plurality of switching circuits is connected at one end to a corresponding one of the taps and connected at the other end to an output node, and has a variable on-resistance value. A control circuit selects continuous n (where n is any integer equal to or greater than 2) of the plurality of switching circuits, turns the n switching circuits on, and sets the respective on-resistance values of the n switching circuits.

12 Claims, 16 Drawing Sheets

$$V_{out} = \frac{X1 \cdot V1 + X2 \cdot V2 + \cdots + Xn \cdot Vn}{X1 + X2 + \cdots + Xn}$$

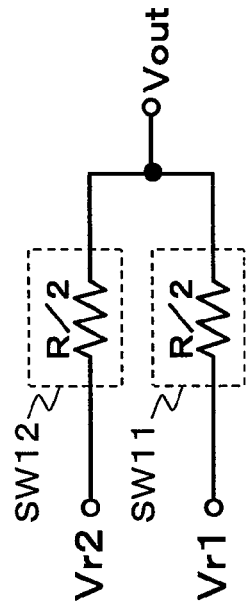
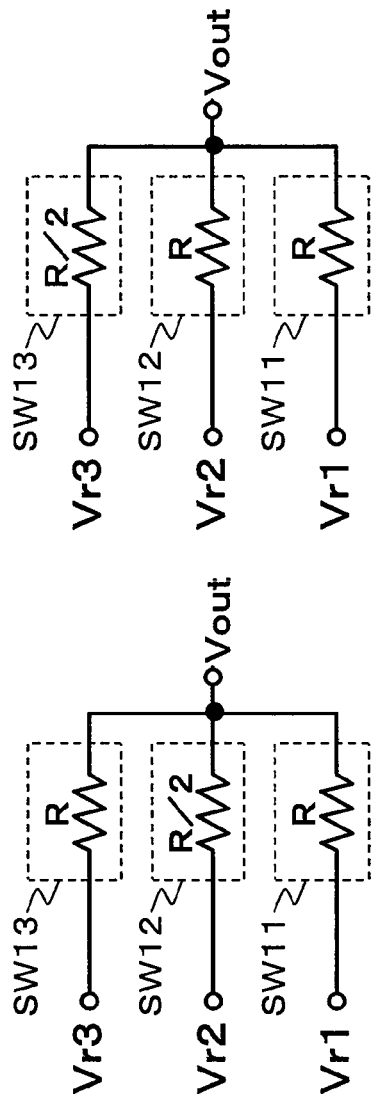
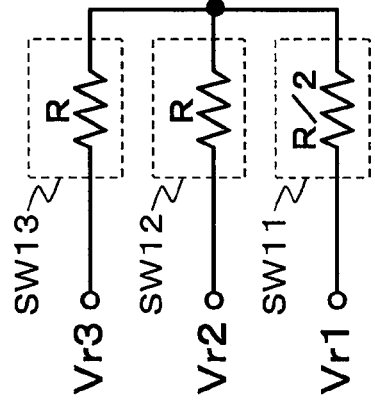

FIG. 4

| | | 1.5 | 1.75 | 2 | 2.25 | 2.5 | 2.75 | 3 | 3.25 | 3.5 | 3.75 | 4 | 4.25 | 4.5 |
|---|---|---|---|---|---|---|---|---|---|---|---|---|---|---|
| SW15 | 500b | — | — | — | — | — | — | — | — | — | — | — | ON | ON |
| | 500a | — | — | — | — | — | — | — | — | — | ON | ON | ON | ON |
| SW14 | 400b | — | — | — | — | — | — | — | ON | ON | — | ON | — | ON |
| | 400a | — | — | — | — | — | ON | ON | ON | ON | ON | ON | ON | ON |
| SW13 | 300b | — | — | — | ON | ON | — | ON | — | ON | ON | — | — | — |
| | 300a | ON | ON | ON | ON | ON | ON | — | ON | ON | ON | ON | ON | — |
| SW12 | 200b | ON | — | ON | — | ON | ON | — | — | — | — | — | — | — |
| | 200a | ON | ON | ON | ON | ON | ON | ON | ON | — | — | — | — | — |
| SW11 | 100b | ON | ON | — | — | — | — | — | — | — | — | — | — | — |
| | 100a | ON | ON | ON | ON | — | — | — | — | — | — | — | — | — |
| Output voltage[v] | | 1.5 | 1.75 | 2 | 2.25 | 2.5 | 2.75 | 3 | 3.25 | 3.5 | 3.75 | 4 | 4.25 | 4.5 |

FIG. 9

| Vg5 | 0 | 0 | 0 | 0 | 0 | 0 | 0 | 0 | 0 | Lv1 | Lv1 | Lv2 | Lv2 |
| --- | --- | --- | --- | --- | --- | --- | --- | --- | --- | --- | --- | --- | --- |
| Vg4 | 0 | 0 | 0 | 0 | 0 | 0 | 0 | Lv2 | Lv1 | Lv1 | Lv2 | Lv2 | Lv2 |
| Vg3 | 0 | Lv1 | Lv1 | Lv2 | Lv1 | Lv2 | Lv2 | Lv2 | Lv2 | Lv2 | Lv1 | Lv1 | 0 |
| Vg2 | Lv2 | Lv1 | Lv2 | Lv1 | Lv2 | Lv1 | 0 | 0 | Lv1 | 0 | 0 | 0 | 0 |
| Vg1 | Lv2 | Lv2 | Lv1 | Lv1 | Lv1 | 0 | 0 | 0 | 0 | 0 | 0 | 0 | 0 |
| Output voltage[v] | 1.5 | 1.75 | 2 | 2.25 | 2.5 | 2.75 | 3 | 3.25 | 3.5 | 3.75 | 4 | 4.25 | 4.5 |

| Gate voltage | 0 | Lv1 | Lv2 |
| --- | --- | --- | --- |
| Transistor's resistance value | ∞ | R | R/2 |

US 7,767,953 B2

VOLTAGE GENERATOR, ANALOG-TO-DIGITAL CONVERTER, AND IMAGE SENSOR SYSTEM

BACKGROUND OF THE INVENTION

The present invention relates to a circuit for generating a voltage, and more particularly relates to a voltage generator which generates a plurality of reference voltages using a resistor ladder and combines these reference voltages to generate a multistep output voltage.

A voltage generator for generating a multistep output voltage is used in various kinds of devices. For example, in a liquid crystal display, this type of voltage generator is used to generate a gray-scale voltage corresponding to a digital value indicating a luminance value, and the liquid crystal panel is driven using the generated gray-scale voltage. Image sensor systems also use voltage generators so as to convert an analog signal obtained by the image sensor circuit to a digital value indicating a luminance value. Other examples of devices that use such a voltage generator include digital-to-analog converters which convert a digital value to an analog signal, ramp generators which generate a ramp voltage whose voltage value increases stepwise, and analog-to-digital converters which convert an analog signal to a digital signal.

A conventional voltage generator includes a resistor ladder for generating a plurality of reference voltages, and a plurality of switches corresponding to a plurality of taps of the resistor ladder, and outputs, as the output voltage, one of the reference voltages by turning one of the switches on. In this way, the multistep output voltage is generated.

In this type of voltage generator, however, the number of reference voltages needs to be increased so as to increase the number of gray-scales of the output voltage. To that end, the number of resistance elements included in the resistor ladder and the number of switches must be increased, resulting in a larger circuit size. For example, 2048 (i.e., $2^{11}$) resistance elements and 2048 switches are necessary to obtain an 11-bit output voltage, and 4096 (i.e., $2^{12}$) resistance elements and 4096 switches are needed to obtain a 12-bit output voltage. In this manner, the greater the number of gray-scales of the output voltage, the larger the circuit size of the voltage generator.

In view of this, Japanese Patent No. 3611672 (Patent Document 1) discloses a technique for increasing the number of gray-scales of an output voltage without increasing the number of resistance elements and switches. In the voltage generator described in Patent Document 1, two switches are simultaneously turned on to generate an intermediate voltage, thereby increasing the number of gray-scales of the output voltage. Furthermore, if more switches are simultaneously turned on, the output voltage will have more gray scales.

SUMMARY OF THE INVENTION

However, as the number of switches that are simultaneously turned on is increased, error in the output voltage becomes larger. For instance, in a case where this type of voltage generator is used to generate a ramp voltage whose voltage value rises stepwise, the differential nonlinearity error of the ramp voltage is increased with an increase in the number of switches that are simultaneously turned on.

In view of the foregoing, it is an object of the present invention to suppress an increase in error in output voltage while achieving a reduction in circuit size.

According to an aspect of the present invention, a voltage generator includes: a ladder resistor circuit for generating a plurality of different reference voltages; a plurality of switching circuits corresponding to a plurality of taps of the ladder resistor circuit, each of the plurality of switching circuits being connected at one end to a corresponding one of the taps and connected at the other end to an output node, and having a variable on-resistance value; and a control circuit for selecting continuous n (where n is any integer equal to or greater than 2) of the plurality of switching circuits, turning the n switching circuits on, and setting the respective on-resistance values of the n switching circuits.

In the voltage generator described above, the n switching circuits are turned on to cause n reference voltages, corresponding to the n switching circuits, to be combined into a composite voltage, which occurs as the output voltage at the output node. Also, since the on-resistance values of the switching circuits are variable, the ratio at which the n reference voltages are combined is adjustable. It is thus possible to generate the multistep output voltage. Furthermore, the potential difference between the minimum and maximum reference voltages of the n reference voltages used to obtain the composite output voltage is reduced as compared with the conventional case, thereby lessening effects of variation in the reference voltages. Therefore, even if the number of switching circuits that are simultaneously turned on is increased, it is possible to keep error in the output voltage from increasing. In this manner, error in the output voltage is kept from increasing while a reduction in circuit size is achieved.

The control circuit may receive a digital signal and select the n switching circuits and set the on-resistance values of the n switching circuits in accordance with a digital value of the digital signal so that an output voltage having a voltage value corresponding to that digital value is generated at the output node.

The voltage generator described above is capable of converting a digital signal to an analog signal, and is also capable of suppressing deterioration in the accuracy of the analog signal while achieving a reduction in circuit size. Thus the voltage generator described above is usable as a digital-to-analog converter.

The control circuit may receive a first clock signal and select the n switching circuits and set the on-resistance values of the n switching circuits in accordance with the first clock signal so that an output voltage generated at the output node has a voltage value that gradually increases or decreases in synchronization with the first clock signal.

The voltage generator described above is capable of generating a ramp voltage whose voltage value increases or decreases stepwise, and is also capable of suppressing an increase in the differential nonlinearity error of the ramp voltage, while achieving a reduction in circuit size. Thus the voltage generator described above is usable as a ramp generator.

According to another aspect of the present invention, an analog-to-digital converter for converting an analog signal to a digital signal includes: the voltage generator described above; a comparator for comparing a voltage value of the analog signal with the voltage value of the output voltage from the voltage generator; and a counter for counting up or down in synchronization with a second clock signal, receiving result of the comparison made by the comparator, and outputting, as the digital signal, a count value when relationship between the analog signal and the output voltage in terms of magnitude is reversed.

In the above-described analog-to-digital converter, deterioration in the accuracy of the digital signal is suppressed while the circuit size is reduced by adopting the voltage generator described above.

According to still another aspect of the present invention, an image sensor system includes: the voltage generator described above; an image sensor circuit including an imaging area and a plurality of processing sections, the imaging area including a plurality of imaging elements arranged in a matrix and each performing photoelectric conversion in which an object's image is converted to an electrical signal, the processing sections being provided for respective columns in the imaging area and each converting the electrical signal obtained by each imaging element belonging to one of the columns corresponding to that processing section to an analog signal and outputting the obtained analog signal; a plurality of comparators corresponding to the plurality of processing sections in the image sensor circuit and each comparing a voltage value of the analog signal output from a corresponding one of the plurality of processing sections with the voltage value of the output voltage from the voltage generator; and a plurality of counters corresponding to the plurality of comparators, each of the plurality of counters counting up or down in synchronization with a second clock signal, receiving result of the comparison made by a corresponding one of the plurality of comparators, and outputting, as a digital signal, a count value when relationship between the analog signal corresponding to that corresponding comparator and the output voltage in terms of magnitude is reversed.

In the above-described image sensor circuit, deterioration in the accuracy of the digital signal is suppressed while the circuit size is reduced by adopting the voltage generator described above.

BRIEF DESCRIPTION OF THE DRAWINGS

FIGS. 3A to 3D are explanatory views of specific examples of the operation of the voltage generator illustrated in FIG. 1.

FIG. 4 is an explanatory view of examples of control of switching circuits illustrated in FIG. 1.

FIG. 9 is an explanatory view of examples of control of switching circuits illustrated in FIG. 8.

DETAILED DESCRIPTION OF THE INVENTION

Figure 1:
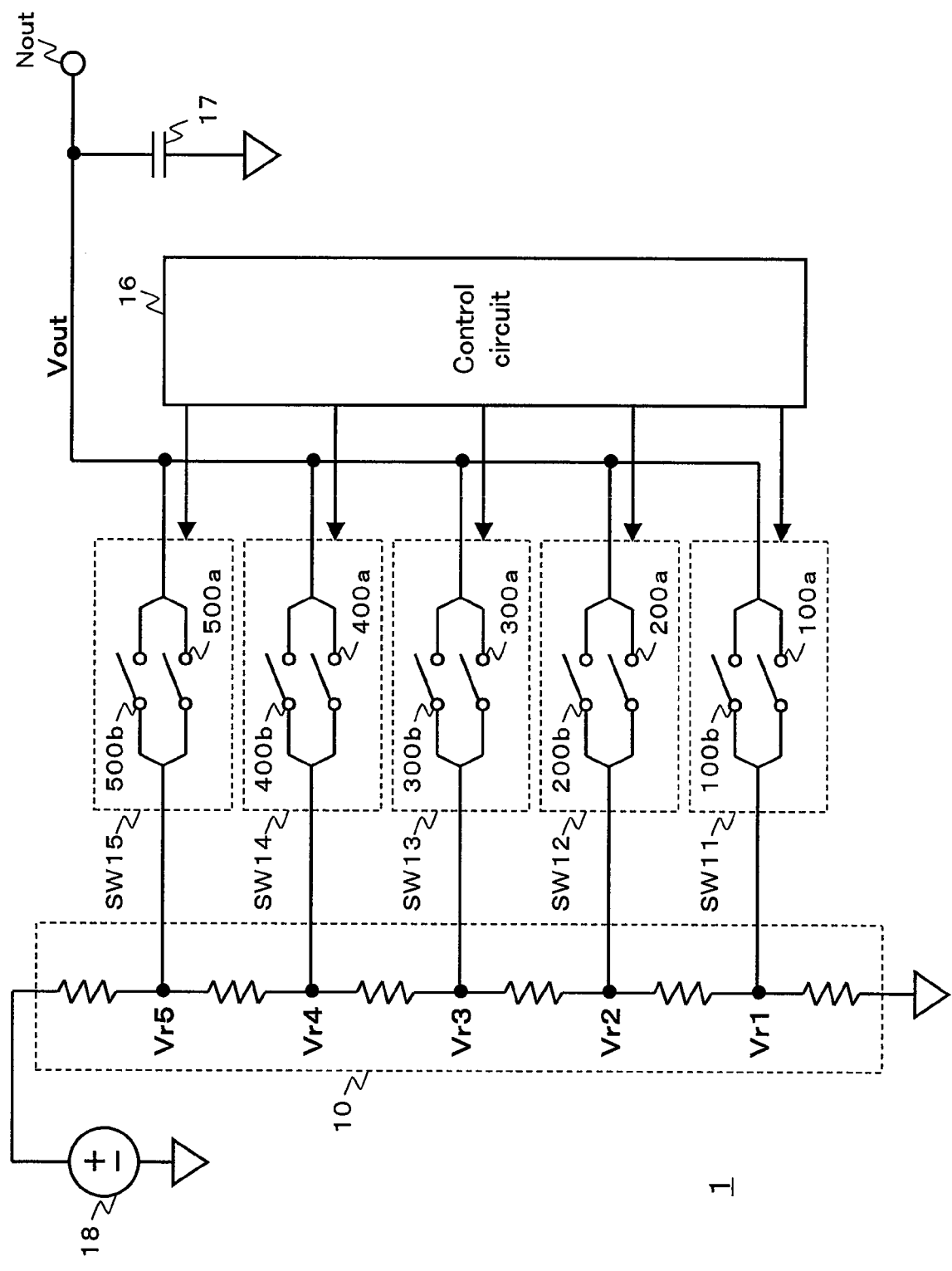
FIG. 1 illustrates the configuration of a voltage generator according to a first embodiment of the present invention.

Hereinafter, the preferred embodiments of the present invention will be described in detail with reference to the accompanying drawings. In the drawings, the same or equivalent components are denoted by the same reference numerals, and description thereof will not be repeated.

First Embodiment

FIG. 1 illustrates the configuration of a voltage generator according to a first embodiment of the present invention. This voltage generator 1 includes a ladder resistor circuit 10 composed of a plurality of serially-connected resistance elements, a plurality of switching circuits SW11 to SW15, a control circuit 16, and a capacitive element 17.

The ladder resistor circuit 10 receives a voltage from a voltage source 18. This causes reference voltages Vr1 to Vr5 to be generated at the respective five taps of the ladder resistor circuit 10.

The switching circuits SW11 to SW15 correspond to the five taps of the ladder resistor circuit 10. The switching circuits SW11 to SW15 are each connected at their one end to a corresponding one of the taps of the ladder resistor circuit 10 and connected at their other end to an output node Nout. In this embodiment, the switching circuits SW11 to SW15 each include two parallel-connected switching elements. On/off control of these two switching elements enables the on-resistance value of each switching circuit to be varied stepwise. For example, in the switching circuit SW11, the on-resistance value thereof is switchable between two levels by turning on only one of the switching elements 100a and 100b or both of them.

The control circuit 16 selects continuous n (n is any integer equal to or greater than 2) of the switching circuits SW11 to SW15, turns the selected n switching circuits on, and sets the respective on-resistance values of the n switching circuits. The control circuit 16 also turns off the unselected switching circuits. In this embodiment, the control circuit 16 performs on/off control of the switching elements included in the selected switching circuits, thereby setting the on-resistance values of these switching circuits. For instance, the control circuit 16 turns the switching elements 100a, 100b, 200a, and 200b on and turns the switching elements 300a to 500a and 300b to 500b off. This means that the switching circuits SW11 and SW12 are selected, and if the on-resistance value per switching element is R, the on-resistance value of each of the switching circuits SW11 and SW12 is set to R/2.

The capacitive element 17 is provided to reduce voltage variation at the output node Nout. This eliminates switching noise caused by the switching circuits SW11 to SW15.

In FIG. 1, the ladder resistor circuit 10 generates the five reference voltages, but may generate six or more reference voltages. Furthermore, although the five switching circuits SW11 to SW15 are illustrated, the voltage generator 1 may include six or more switching circuits.

Figure 2:
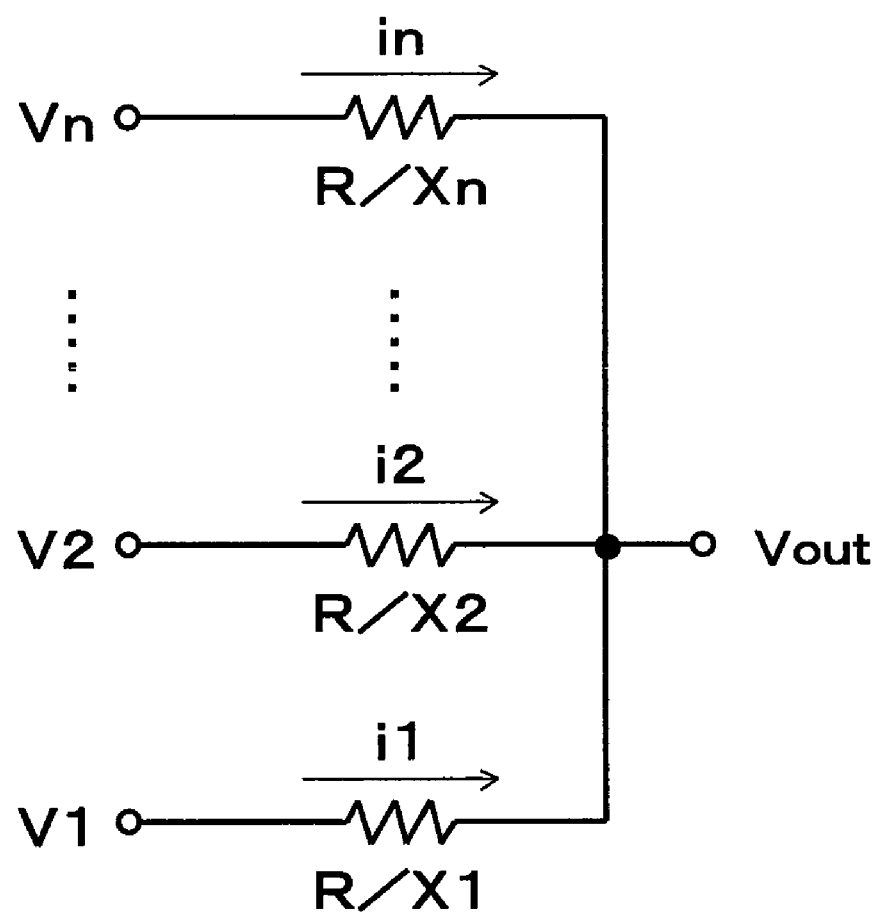
FIG. 2 is an explanatory view of operation of the voltage generator illustrated in FIG. 1.

Next, operation of the voltage generator 1 illustrated in FIG. 1 will be described with reference to FIG. 2. It is assumed herein that in the voltage generator 1, the ladder resistor circuit 10 generates m (m is any integer equal to or greater than 2) reference voltages and m switching circuits are provided. It is also assumed that continuous n (n≦m) of the m switching circuits are selected and that the on-resistance values of the n switching circuits are set to R/X1, R/X2, ..., R/Xn.

The selected n switching circuits correspond to continuous n reference voltages V1 to Vn. When the n switching circuits are turned on, currents i1, i2, ..., in are generated between the output node Nout and the n nodes (i.e., those taps of the ladder resistor circuit) at which the n reference voltages V1 to Vn are generated. The currents i1, i2, ..., in are expressed as follows:

$i1=(X1/R)\cdot(V1-Vout)$ [Expression 1]

$i2=(X2/R)\cdot(V2-Vout)$ [Expression 2]

$in=(Xn/R)\cdot(Vn-Vout)$ [Expression 3]

$i1+i2+\ldots+in=0$ [Expression 4]

From Expressions 1 to 4, the output voltage Vout is calculated as follows:

$Vout=(X1\cdot V1+X2\cdot V2+\ldots+Xn\cdot Vn)/(X1+X2+\ldots+Xn)$

As can be seen from the above expressions, since the on-resistance value of each switching circuit is made variable, the ratio at which the reference voltages V1, V2, ..., Vn are combined becomes adjustable, allowing the multistep output voltage Vout to be generated.

Next, with reference to FIGS. 3A to 3D, a description will be made of examples of control in which, in the voltage generator 1 shown in FIG. 1, four of the switching elements 100a to 500a and 100b to 500b are turned on. In these examples, it is assumed that the reference voltages Vr1, Vr2, Vr3, Vr4, and Vr5 are 1 V, 2 V, 3 V, 4 V, and 5 V, respectively, and that the switching elements have a resistance value of R.

(A) In the case in which the switching elements 100a, 100b, 200a, and 200b are turned on.

As shown in FIG. 3A, the switching circuits SW11 and SW12 are selected, and the resistance value of each of the switching circuits SW11 and SW12 is set to R/2. The output voltage Vout is expressed as $Vout=(Vr1+Vr2)/2=3/2=1.5\ V.$ (B) In the case in which the switching elements 100a, 100b, 200a, and 300b are turned on.

As shown in FIG. 3B, the switching circuits SW11, SW12 and SW13 are selected, and the resistance value of the switching circuit SW11 is set to R/2, while the resistance value of each of the switching circuits SW12 and SW13 is set to R. The output voltage Vout is expressed as $Vout=(2\cdot Vr1+Vr2+Vr3)/4=7/4=1.75\ V.$ (C) In the case in which the switching elements 100a, 200a, 200b, and 300a are turned on.

As shown in FIG. 3C, the switching circuits SW11, SW12 and SW13 are selected, and the resistance value of each of the switching circuits SW11 and SW13 is set to R, while the resistance value of the switching circuit SW12 is set to R/2. The output voltage Vout is expressed as $Vout=(Vr1+2\cdot Vr2+Vr3)/4=8/4=2\ V.$ (D) In the case in which the switching elements 100a, 200a, 300a, and 300b are turned on.

As shown in FIG. 3D, the switching circuits SW11, SW12 and SW13 are selected, and the resistance value of each of the switching circuits SW11 and SW12 is set to R, while the resistance value of the switching circuit SW13 is set to R/2. The output voltage Vout is expressed as $Vout=(Vr1+Vr2+2\cdot Vr3)/4=9/4=2.25\ V.$ In this way, it is possible to change the voltage value of the output voltage Vout by 0.25 V. Furthermore, as shown in FIG. 4, on/off control of the switching elements 100a to 500a and 100b to 500b enables generation of the output voltage Vout of thirteen gray-scale levels in the range from 1.5 V to 4.5 V.

Next, in the voltage generator 1 shown in FIG. 1, comparisons are made between cases in which the on-resistance values of the switching circuits are variable and not variable. In the examples described below, an about 11-bit (about 2048-gray-scale) output voltage Vout is generated.

In the case where the on-resistance values of the switching circuits are not variable in the voltage generator 1, each switching circuit includes only one switching element. In this case, the configuration for generating an about 11-bit output voltage may be either of the following two examples. In the description below, the term "the number of reference voltages" means the number of reference voltages that are generated in the ladder resistor circuit 10, the term "the number of switching circuits" means the total number of switching circuits included in the voltage generator, and the term "the number of switching elements" means the total number of switching elements included in the switching circuits.

(1) In the case in which the on-resistance values of the switching circuits are not variable [2-bit interpolation]

The number of reference voltages: 512
The number of switching circuits: 512
The number of switching elements: 512
The number of switching elements that are simultaneously turned on: 4

In this case, if the 512 reference voltages are 1 V, 2 V, ..., and 512 V, respectively, the minimum value Vmin1, the second-minimum voltage value Vmin2, and the maximum value Vmax of the output voltage are expressed as follows:

$Vmin1=(1+2+3+4)/4=2.5\ V$ $Vmin2=(1+2+3+5)/4=2.75\ V$ $Vmax=(509+510+511+512)/4=510.5\ V$ The amount of voltage increase Vd per gray-scale of the output voltage is $Vd=0.25\ V.$ In this manner, four of the 512 reference voltages are combined to generate approximately 2048 (2033 to be exact) voltages.

(2) In the case where the on-resistance values of the switching circuits are not variable [3-bit interpolation]

The number of reference voltages: 256
The number of switching circuits: 256
The number of switching elements: 256
The number of switching elements that are simultaneously turned on: 8

In this case, if the 256 reference voltages are 1 V, 2 V, ..., 256 V, respectively, the minimum value Vmin1, the second-minimum voltage value Vmin2, and the maximum value Vmax of the output voltage are expressed as follow:

$$V\mathrm{min}1=(1+2+3+4+5+6+7+8)/8=4.5\mathrm{V}$$

$$V\mathrm{min}2=(1+2+3+4+5+6+7+9)/8=4.625\mathrm{V}$$

$$V\mathrm{max}=(249+250+\ldots+255+256)/8=252.5\mathrm{V}$$

The amount of voltage increase Vd per gray-scale of the output voltage is $$Vd=0.125\mathrm{V}.$$

In this manner, eight of the 256 reference voltages are combined to generate approximately 2048 (1985 to be exact) voltages.

On the other hand, in the case where the on-resistance values of the switching circuits are variable in the voltage generator 1, the following example may be adopted as the configuration for generating an about 11-bit output voltage.

(3) In the case where the on-resistance values of the switching circuits are variable [3-bit interpolation]
  The number of reference voltages: 256
  The number of switching circuits: 256
  The number of switching elements: 512
  The number of switching elements that are simultaneously turned on: 8

In this case, if the 256 reference voltages are 1 V, 2 V, ..., 256 V, respectively, the minimum value Vmin1, the second-minimum voltage value Vmin2, and the maximum value Vmax of the output voltage are expressed as follow:

$$V\mathrm{min}1=(1+2+3+4)/4=2.5\mathrm{V}$$

$$V\mathrm{min}2=(2+4+6+4+5)/8=2.625\mathrm{V}$$

$$V\mathrm{max}=(253+254+255+256)/4=254.5\mathrm{V}$$

The amount of voltage increase Vd per gray-scale of the output voltage is $$Vd=0.125\mathrm{V}.$$

In this manner, four or five of the 256 reference voltages are combined to generate about 2048 (2017 to be exact) voltages.

When the cases (1) and (3) are compared, it is found that if the on-resistance values of the switching circuits are made switchable between two levels, it is possible to reduce by half the number of reference voltages generated in the ladder resistor circuit 10. That is, the number of resistance elements included in the ladder resistor circuit 10 is reduced to half.

The following simulations were also performed for voltage generators configured in the manners described in the cases (1), (2), and (3). First, the respective on-resistance values of the switching elements were set in such a manner that the relative variation showed a normal distribution in which σ=3%. That is, the on-resistance value of each switching element was set so as to vary within ±3% with respect to the on-resistance reference value. The resistance value of each of the resistance elements included in the ladder resistor circuit was set so as to be one hundredth of the switching element on-resistance reference value. After these settings, on/off control of the switching elements was performed so as to gradually increase the voltage value of the output voltage Vout, thereby generating a ramp voltage whose voltage value increased stepwise. And the differential nonlinearity error of the ramp voltage was obtained each time the voltage value of the ramp voltage increased by one step, and then one of the obtained errors whose absolute value was the largest was obtained as a sample. That is, with an ideal voltage increase per step having been 1 LSB, the difference between an actual voltage increase and the ideal voltage increase was obtained by LSB units. Such a trial was performed 1000 times.

Figure 5:
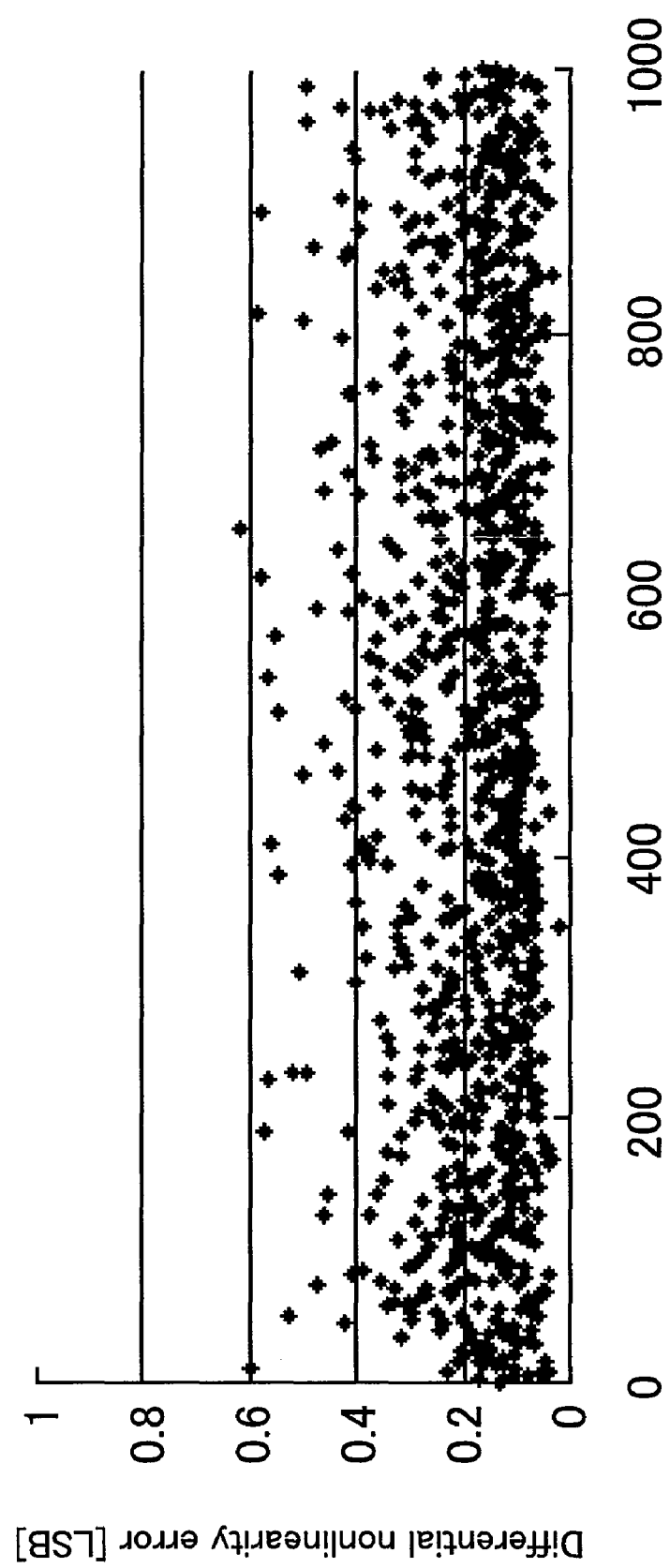
FIG. 5 is an explanatory view of error in output voltage when 2-bit interpolation is performed in a voltage generator in which the resistance values of switching circuits are not variable.
Figure 6:
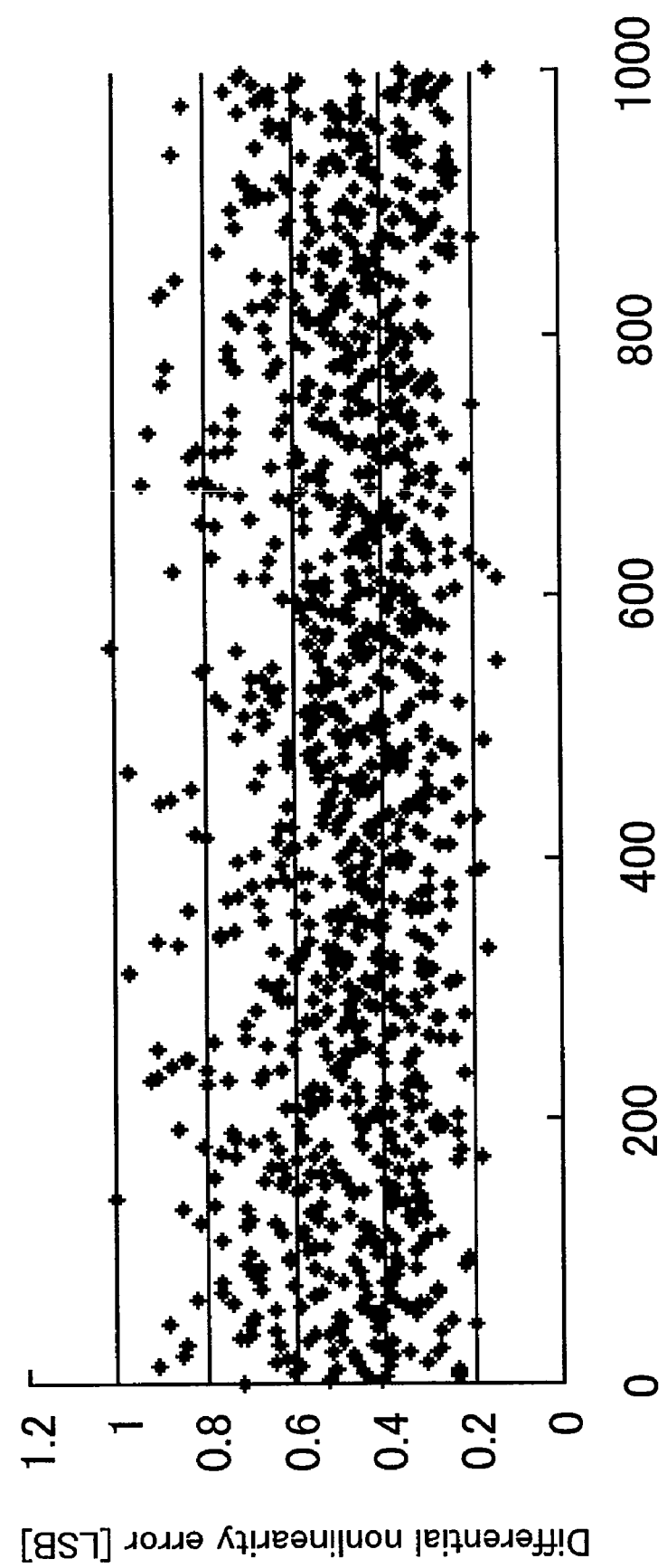
FIG. 6 is an explanatory view of error in output voltage when 3-bit interpolation is performed in a voltage generator in which the resistance values of switching circuits are not variable.
Figure 7:
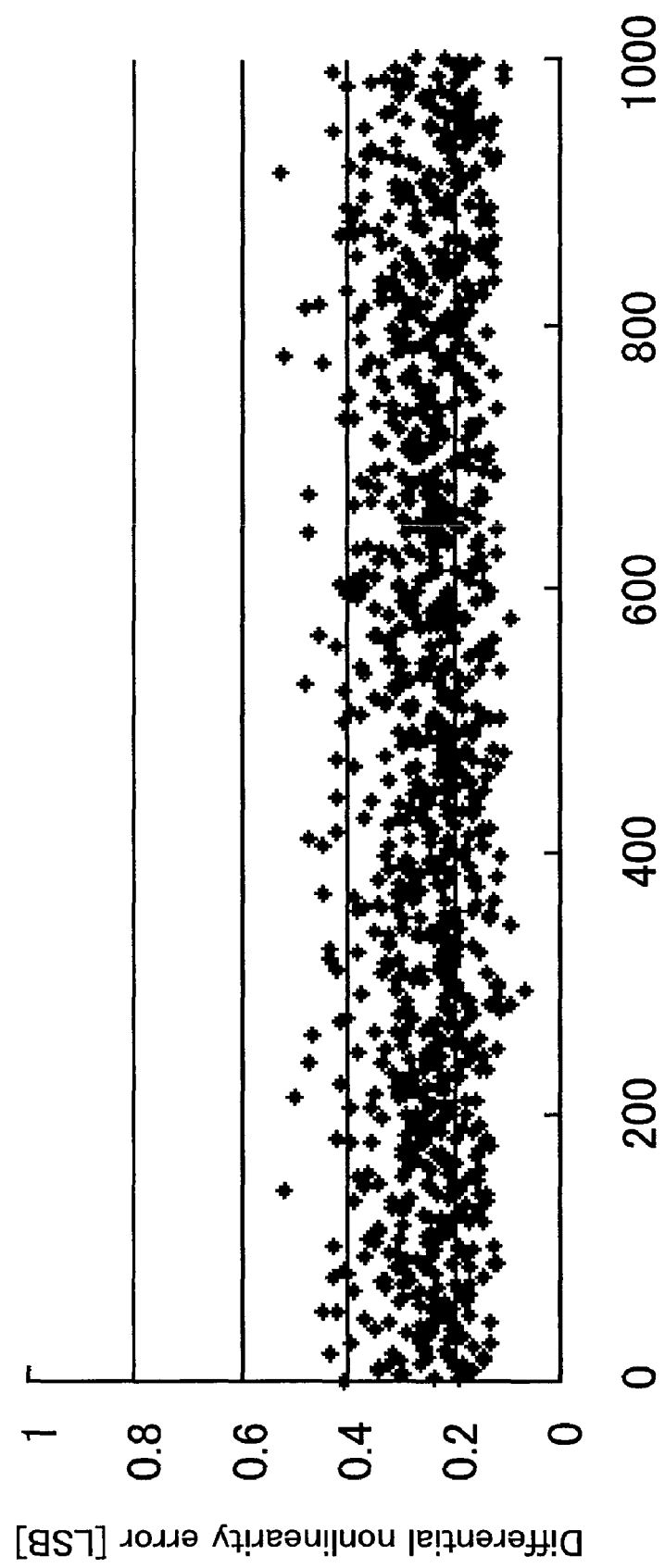
FIG. 7 is an explanatory view of error in output voltage when 3-bit interpolation is performed in a voltage generator in which the resistance values of switching circuits are variable.

FIGS. 5, 6, and 7 show the simulation results corresponding to the cases (1), (2), and (3), respectively. In the figures, the abscissa indicates the number of trials, while the ordinate indicates the sampled differential nonlinearity error.

Comparisons between FIGS. 5 and 6 show that in the case in which the on-resistance values of the switching circuits are not variable, as the number of switching elements that are simultaneously turned on is increased, the differential nonlinearity error becomes greater. For example, when the differential nonlinearity error must be reduced to 0.8 LSB or less, it is not possible to configure a voltage generator in the way described in the case (2).

On the other hand, when FIGS. 6 and 7 are compared, it is found that the differential nonlinearity error in the case (3) is less than that in the case (2). For instance, even when the differential nonlinearity error must be decreased to 0.8 LSB or less, a voltage generator can be configured in the manner described in the case (3). One of the probable reasons for the reduced error is that the potential difference between the minimum and maximum reference voltages of the n reference voltages used to generate the composite output voltage is reduced, thereby lessening effects of variation in the reference voltages. Another probable reason is that the fact that the two switching elements are connected in parallel in each switching circuit allows variations in the on-resistance values of the switching elements to be averaged.

In this way, it is possible to keep the error in the output voltage from increasing, while reducing the circuit size.

It should be noted that each of the switching circuits SW11 to SW15 may include three or more switching elements. As the number of switching elements contained in the switching circuits is increased, the number of steps in which the on-resistance values of the switching circuits are changed is increased, resulting in a further increase in the number of gray-scales of the output voltage. In addition, since variations in the on-resistance of the switching elements are averaged, the error in the output voltage is reduced further.

Modified Example of the First Embodiment

Figure 8:
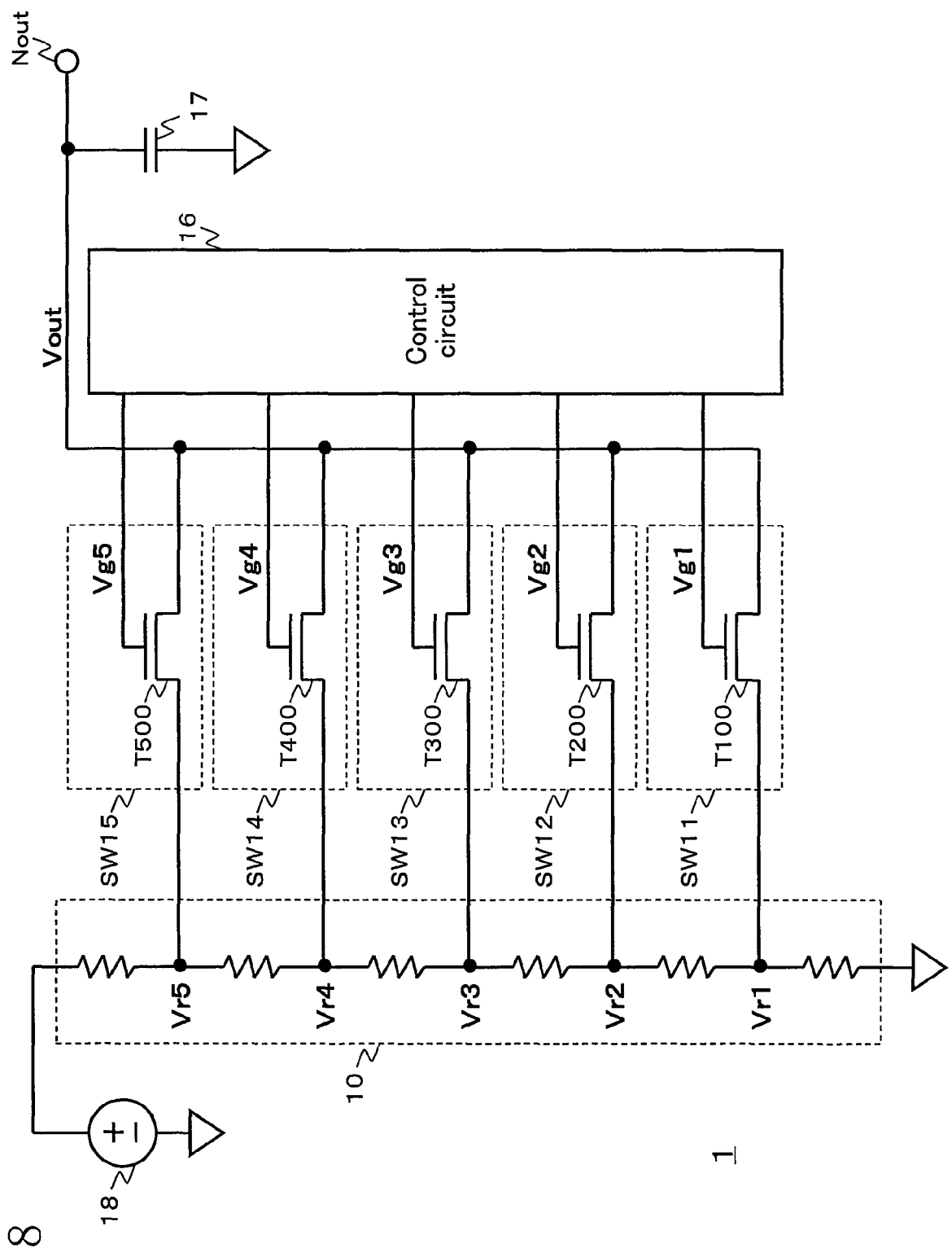
FIG. 8 is an explanatory view of a modified example of the voltage generator illustrated in FIG. 1.

As shown in FIG. 8, the switching circuits SW11 to SW15 may include transistors T100 to T500. In this case, the control circuit 16 sets the on/off states and on-resistance values of the switching circuits SW11 to SW15 by controlling the gate voltages Vg1 to Vg5 of the transistors T100 to T500. For example, if the voltage value of the gate voltage when the transistor's on-resistance value is R is Lv1, and the voltage value of the gate voltage when the transistor's on-resistance value is R/2 is Lv2, it is possible to generate a multistep output voltage by controlling the gate voltages Vg1 to Vg5 of the transistors T100 to T500 as shown in FIG. 9. When configured in this manner, the switching circuits SW11 to SW15 are allowed to have their circuit size reduced further.

[Digital-to-Analog Converter]

Figure 10:
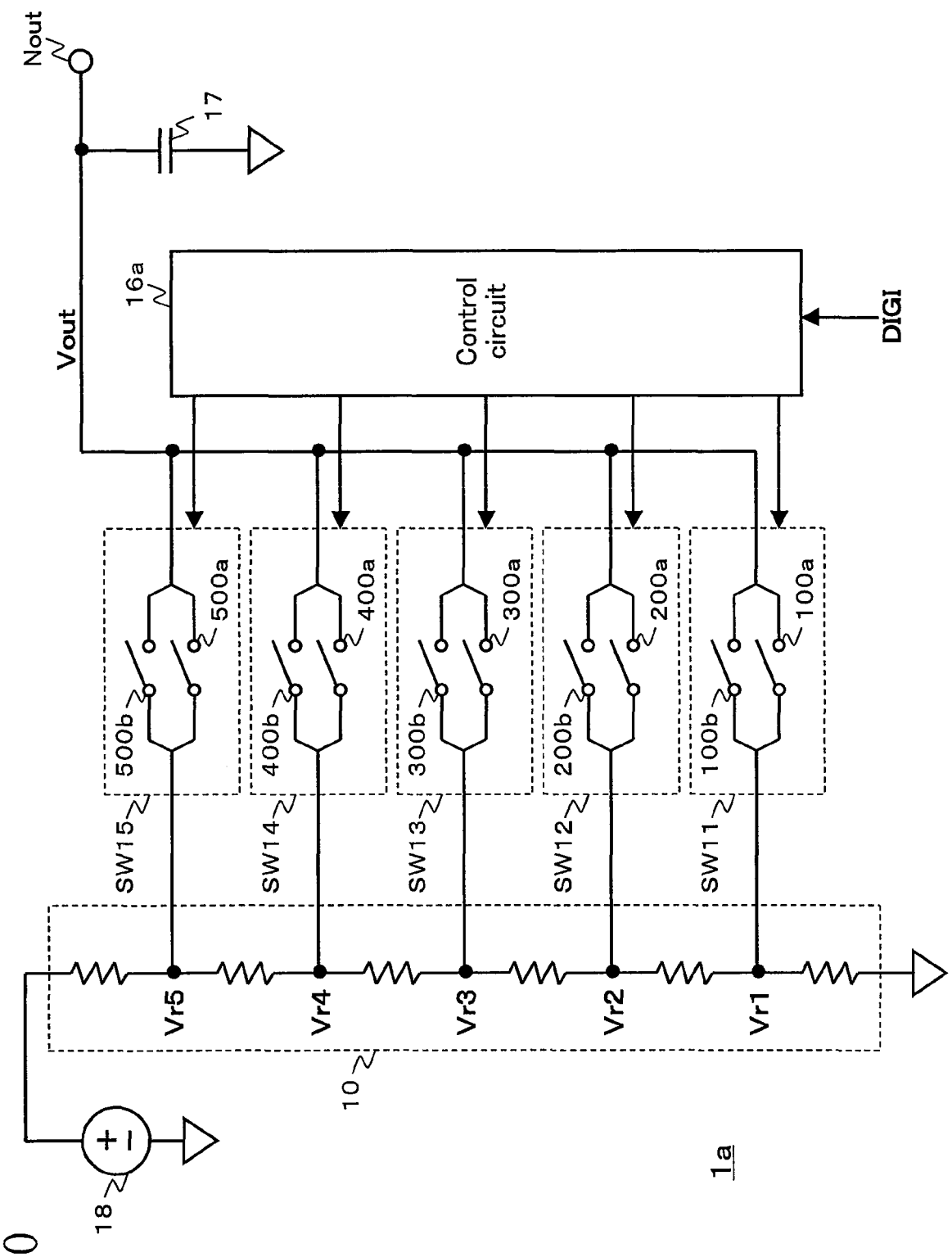
FIG. 10 is a block diagram in which the voltage generator illustrated in FIG. 1 is used as a digital-to-analog converter.

Moreover, as shown in FIG. 10, the voltage generator shown in FIG. 1 may also be used as a digital-to-analog converter. In the digital-to-analog converter 1a shown in FIG. 10, a control circuit 16a receives a digital signal DIGI and controls the on/off states and on-resistance values of the switching circuits SW11 to SW15 in accordance with the digital value of the digital signal DIGI so that an output voltage Vout having a voltage value corresponding to that digital value is output. For instance, the on/off states and on-resistance values of the switching circuits SW11 to SW15 are correlated in advance with respective digital values in such a manner that the voltage value of the output voltage Vout is increased as the digital value becomes higher. And the control circuit 16a controls the switching circuits SW11 to SW15 in accordance with those correlations, thereby enabling generation of an output voltage corresponding to the digital value of the digital signal DIGI. In this manner the voltage generator 1 in FIG. 1 used as the digital-to-analog converter suppresses deterioration in analog signal accuracy, while achieving a reduction in circuit size.

[Ramp Generator]

Figure 11:
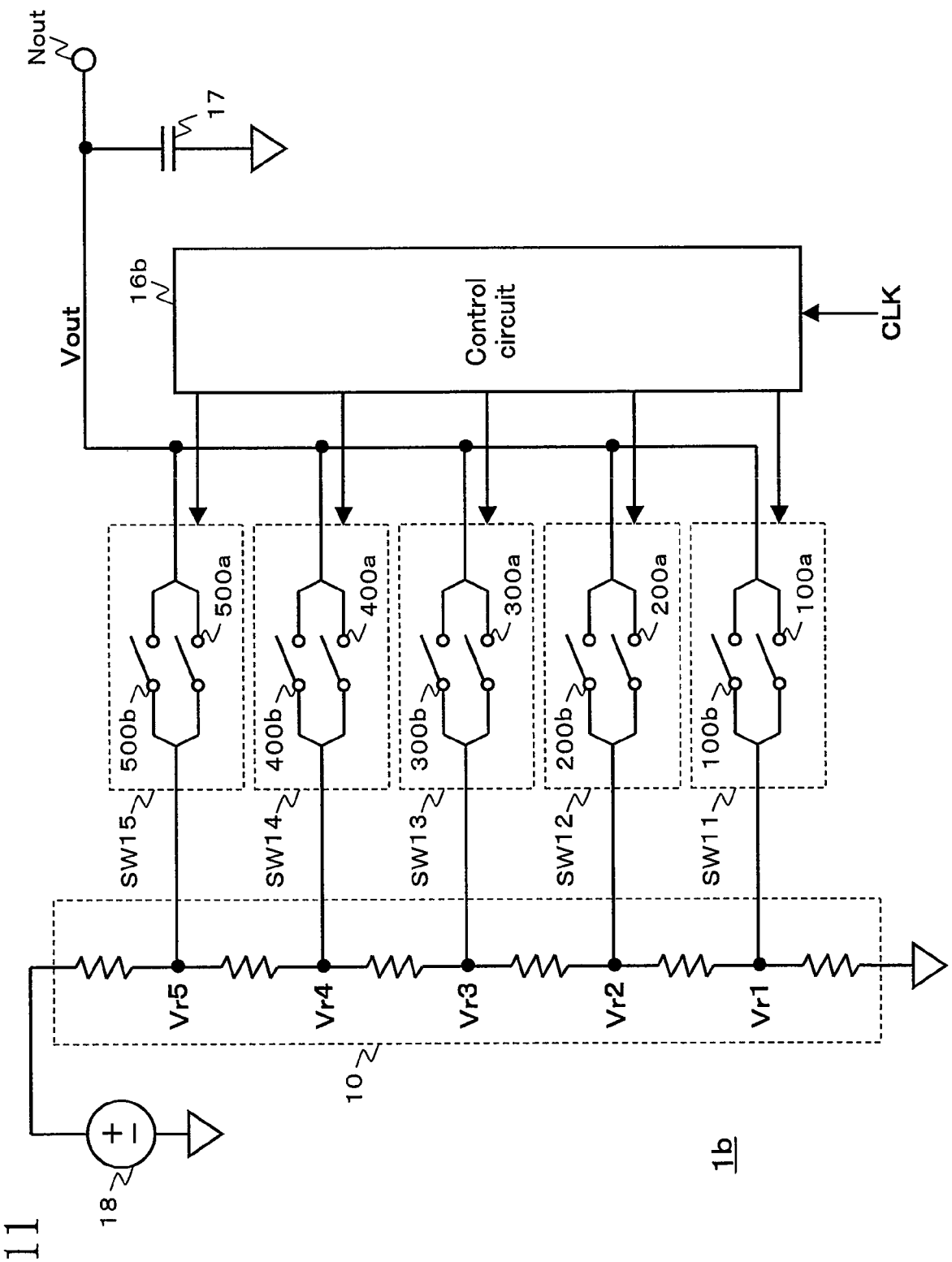
FIG. 11 is a block diagram in which the voltage generator illustrated in FIG. 1 is used as a ramp generator.

Furthermore, as shown in FIG. 11, the voltage generator shown in FIG. 1 can also be used as a ramp generator. In the ramp generator 1b illustrated in FIG. 11, a control circuit 16b receives a clock signal CLK and controls the on/off states and on-resistance values of the switching circuits SW11 to SW15 in synchronization with the clock signal CLK so that the voltage value of an output voltage Vout gradually increases in synchronization with the clock signal CLK. For example, the on/off states and on-resistance values of the switching circuits SW11 to SW15 are correlated in advance with a plurality of values in such a manner that the voltage value of the output voltage Vout gradually increases as the number of clock cycles increases. And the control circuit 16b controls the switching circuits SW11 to SW15 according to those correlations, thereby enabling generation of a ramp voltage synchronized with the clock signal CLK. Alternatively, in the ramp generator 1b, the control circuit 16b may perform the control in such a manner that the voltage value of the output voltage Vout is gradually decreased in synchronization with the clock signal CLK. When the ramp generator is configured in this manner, the differential nonlinearity error of the ramp voltage is kept from increasing, while the circuit size is reduced.

[Other Configurations]

Figure 12:
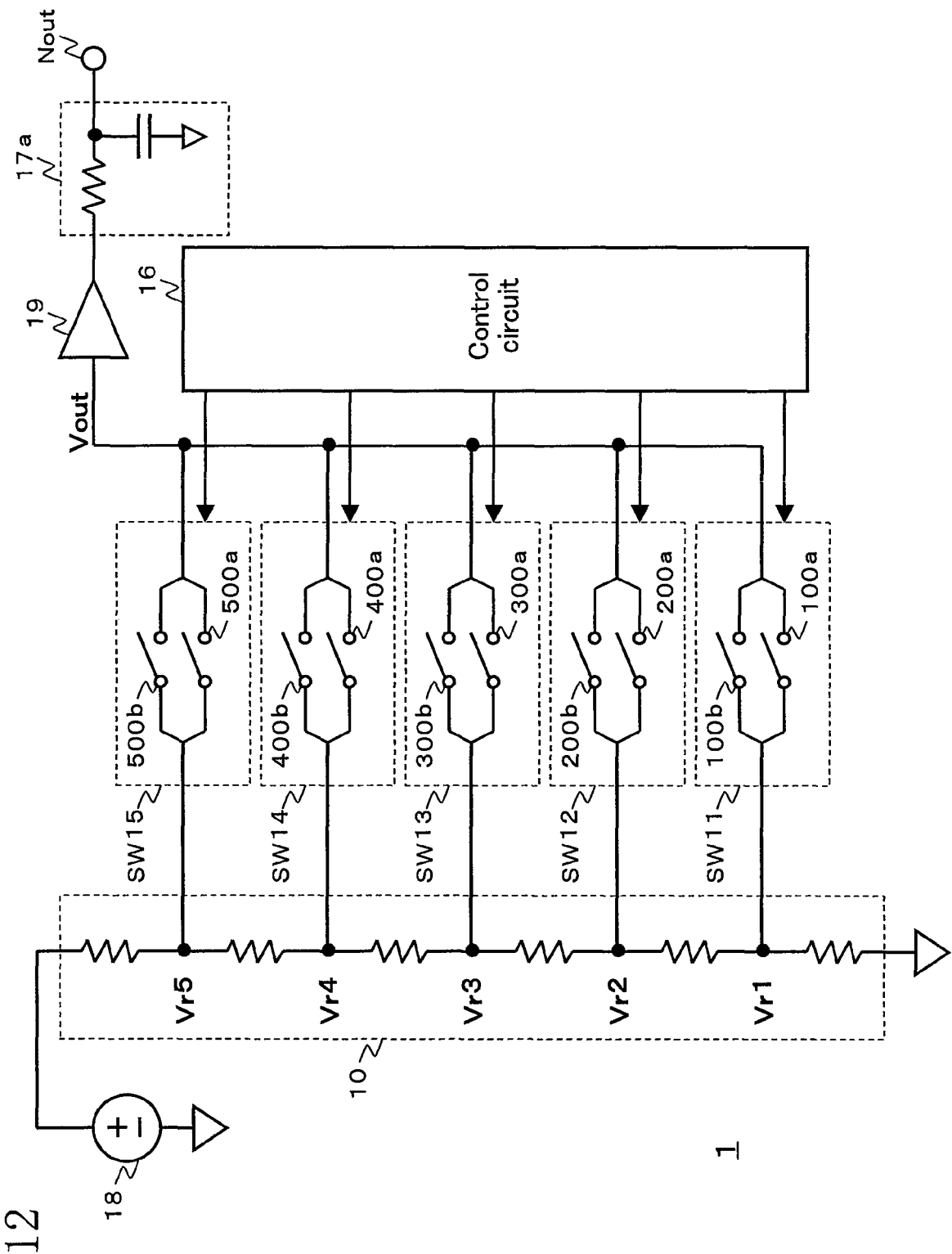
FIG. 12 is an explanatory view of another modified example of the voltage generator illustrated in FIG. 1.

In a case in which, as shown in FIG. 12, the voltage generator 1 is provided with a buffer 19 and a low-pass filter 17a in place of the capacitive element 17 shown in FIG. 1, switching noise caused by the switching circuits SW11 to SW15 is also reduced.

Furthermore, the voltage source 18 may be replaced with a current source, or voltage sources or current sources may be provided at both ends of the ladder resistor circuit 10. These voltage sources or current sources may be variable. When the voltage generator 1 is configured in this manner, the polarity and dynamic range of the output voltage Vout, and the output impedance of the output node Nout can be set at will.

Second Embodiment

Figure 13:
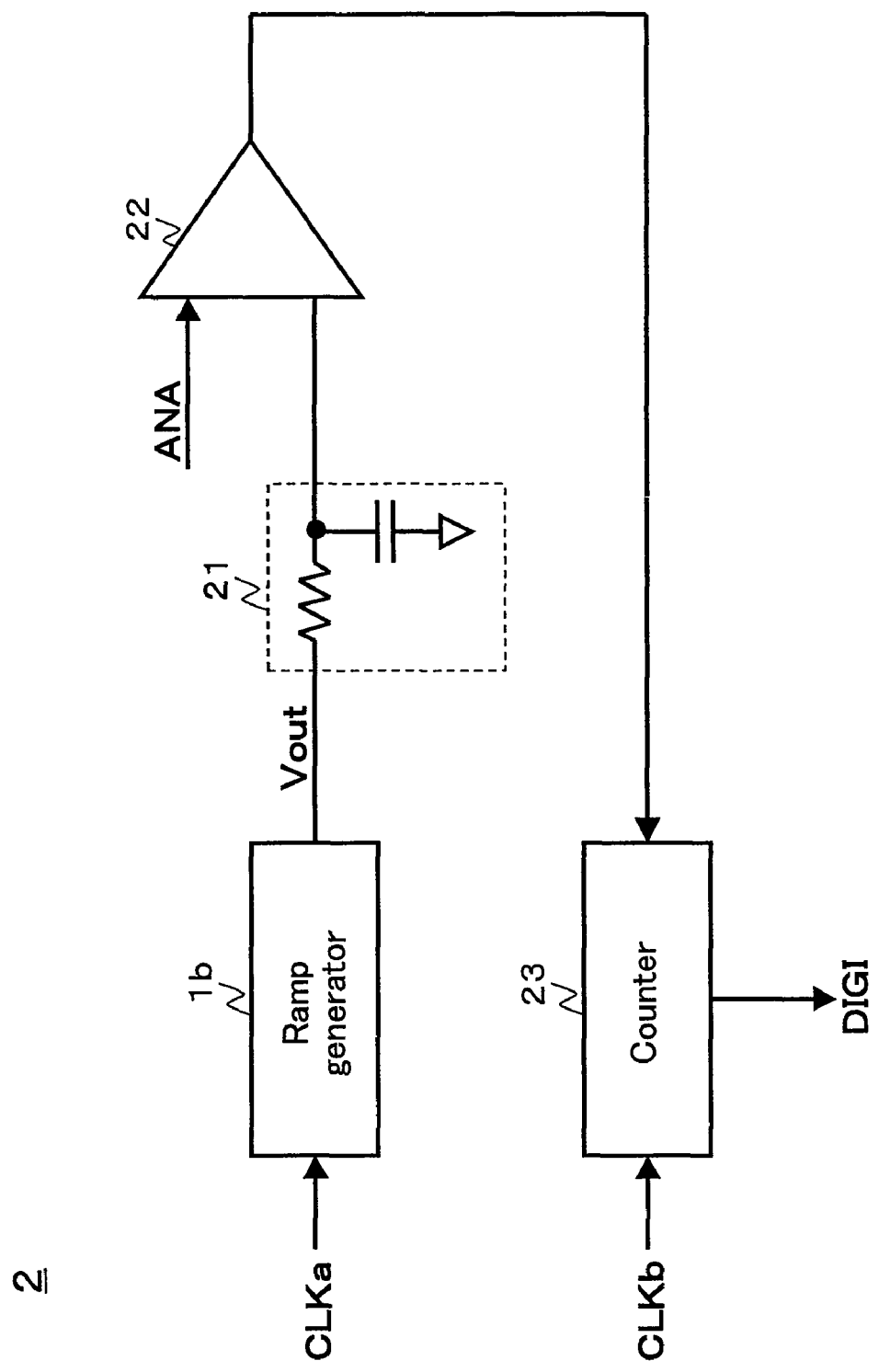
FIG. 13 illustrates the configuration of an analog-to-digital converter according to a second embodiment of the present invention.

FIG. 13 illustrates the configuration of an analog-to-digital converter according to a second embodiment of the present invention. The analog-to-digital converter 2 includes the ramp generator 1b shown in FIG. 11, a low-pass filter 21, a comparator 22, and a counter 23.

The ramp generator 1b gradually increases the voltage value of the output voltage Vout in synchronization with a clock signal CLKa.

The low-pass filter 21 is provided for removal of switching noise in the ramp generator 1b and for smoothing of the signal waveform of the output voltage.

The comparator 22 compares the voltage value of the output voltage Vout supplied through the low-pass filter 21 with the voltage value of an analog signal ANA. When relationship between the output voltage Vout and the analog signal ANA in terms of magnitude is reversed, the output of the comparator 22 is reversed.

The counter 23 counts up in synchronization with a clock signal CLKb while receiving the output of the comparator 22. The counter 23 also outputs, as a digital signal DIGI, the count value when the output of the comparator 22 is reversed (that is, when the relationship between the output voltage Vout and the analog signal ANA in terms of magnitude is reversed).

Figure 14:
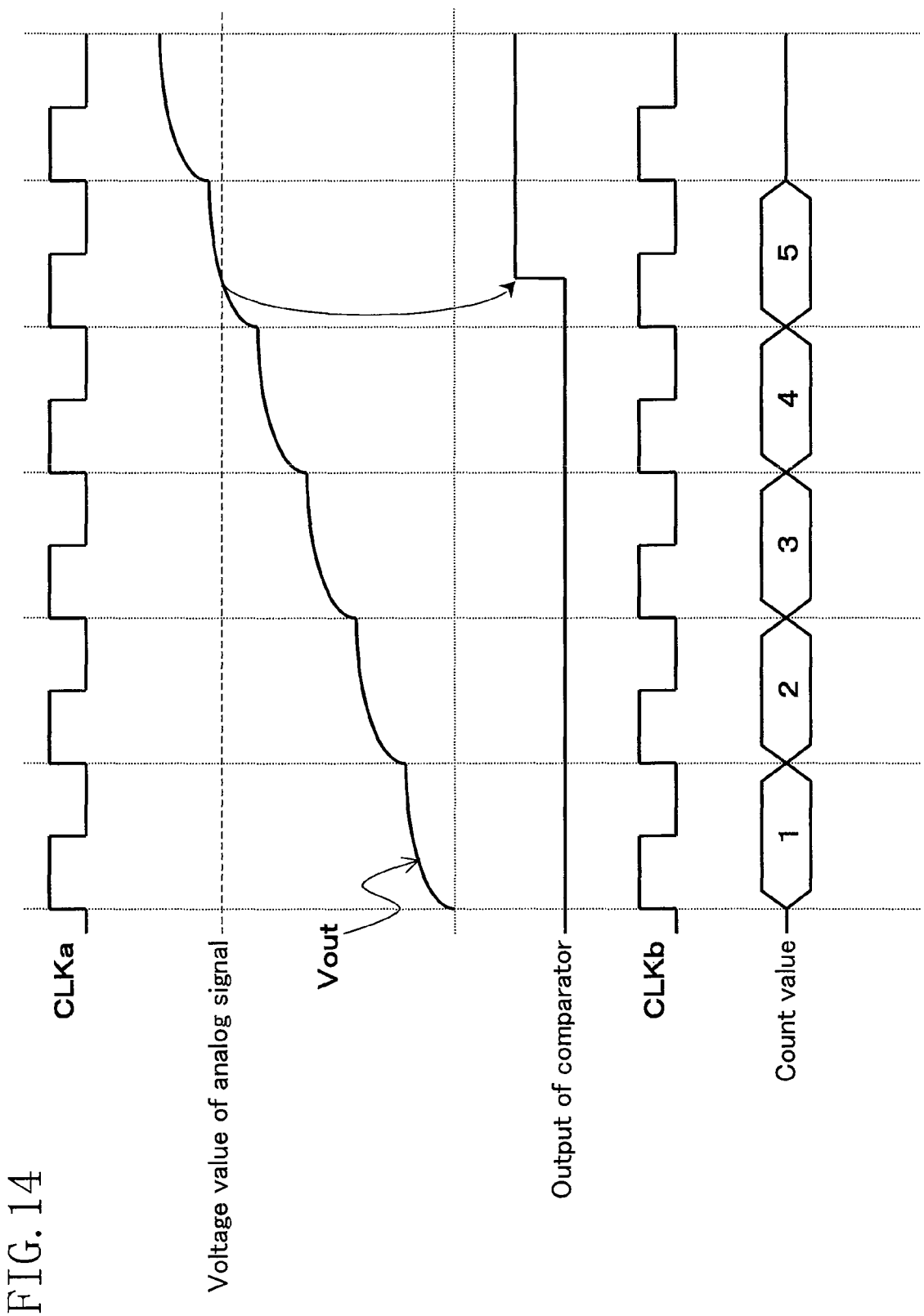
FIG. 14 is an explanatory view of an example of operation of the analog-to-digital converter illustrated in FIG. 13.

Next, with reference to FIG. 14, operation of the analog-to-digital converter illustrated in FIG. 13 will be described. The ramp generator 1b gradually increases the voltage value of the output voltage Vout in synchronization with the clock signal CLKa. Meanwhile, the count value of the counter 23 is also gradually incremented in synchronization with the clock signal CLKb. When the voltage value of the output voltage Vout reaches the voltage value of the analog signal ANA, the output of the comparator 22 changes from the low level to the high level and the count value of the counter 23 is output as the digital signal DIGI.

By employing the ramp generator 1b illustrated in FIG. 11 in the analog-to-digital converter, it is possible to suppress deterioration in the accuracy of the analog signal, while reducing the circuit size of the analog-to-digital converter.

Figure 15:
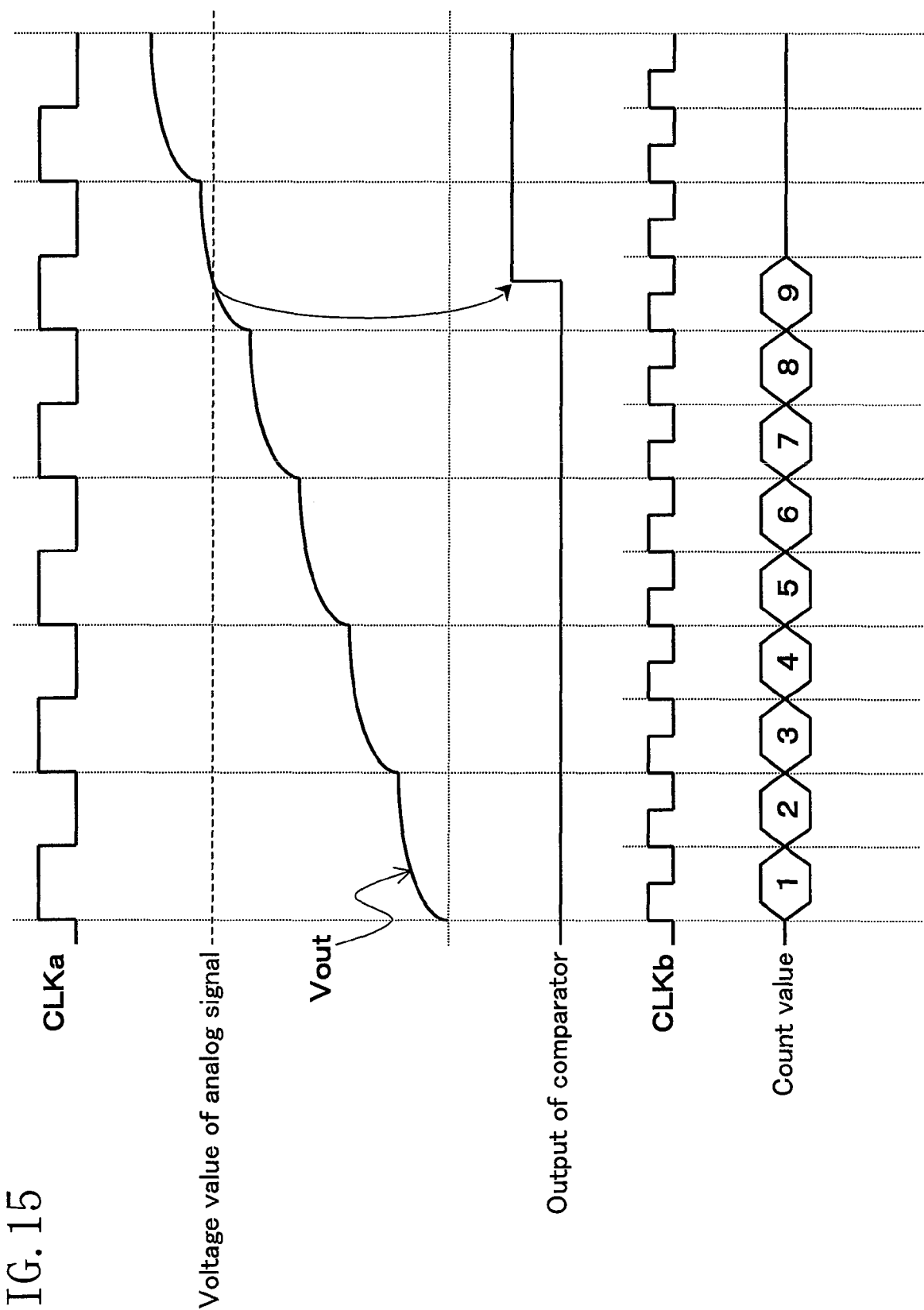
FIG. 15 is an explanatory view of another example of the operation of the analog-to-digital converter illustrated in FIG. 13.

If, as shown in FIG. 15, the frequency of the clock signal CLKb supplied to the counter 23 is made higher than that of the clock signal CLKa supplied to the ramp generator 1b, higher-definition digital signals are obtainable.

In a case in which the ramp generator 1b gradually decreases the voltage value of the output voltage Vout in synchronization with the clock signal CLKa, analog-to-digital conversion can also be performed. In this case, the counter 23 may be configured so as to count down in synchronization with the clock signal CLKb.

Third Embodiment

Figure 16:
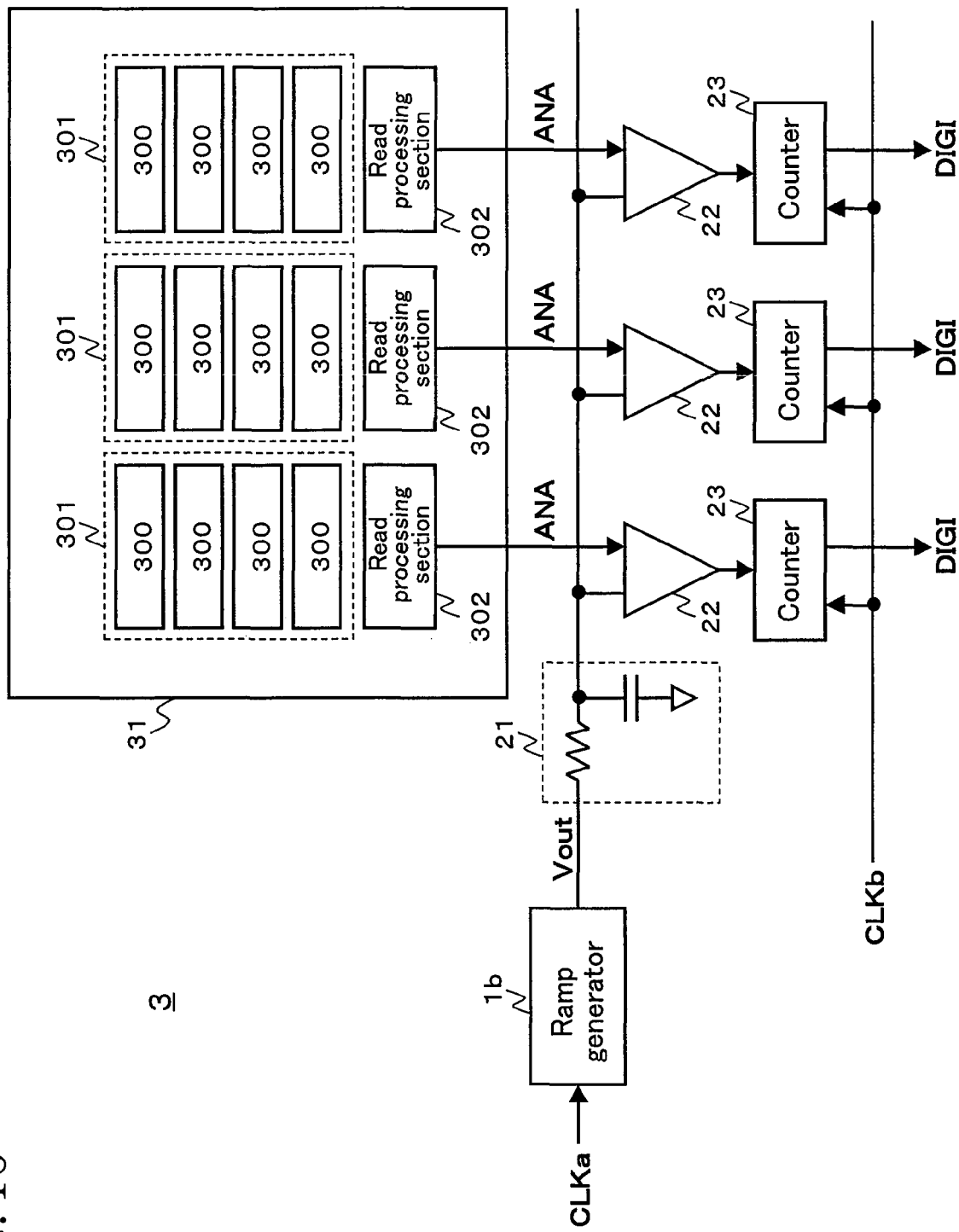
FIG. 16 illustrates the configuration of an image sensor system according to a third embodiment of the present invention.

FIG. 16 illustrates the configuration of an image sensor system according to a third embodiment of the present invention. This image sensor system 3 includes the ramp generator 1b shown in FIG. 11, a low-pass filter 21, an image sensor circuit 31, a plurality of comparators 22, and a plurality of counters 23.

The image sensor circuit 31 includes an imaging area composed of a plurality of imaging elements 300 arranged in a matrix, and a plurality of read processing sections 302 provided for the respective columns 301 in the imaging area.

Each imaging element 300 performs photoelectric conversion in which an object's image is converted to an electrical signal. Each read processing section 302 receives the electrical signal obtained by each imaging element 300 belonging to one of the columns 301 in the imaging area that corresponds to that read processing section 302, and performs correlated double sampling or the like on the received electrical signal to thereby convert the electrical signal to an analog signal ANA indicating a luminance level.

The comparators 22 correspond to the analog signals ANA (output from the respective columns) from the image sensor circuit 31. Each comparator 22 compares the voltage value of a corresponding one of the analog signals ANA with the voltage value of the output voltage Vout.

The counters 23 correspond to the comparators 22. Each counter 23, which counts up in synchronization with a clock signal CLKb, receives the output of one of the comparators 22 corresponding to that counter 23, and outputs, as a digital signal DIGI, the count value when the output of that comparator 22 is reversed. In this way, each analog signal ANA is converted to the digital signal DIGI indicating a luminance value.

By employing the ramp generator 1b illustrated in FIG. 11 in the image sensor system, it is possible to suppress deterioration in the digital signal accuracy, while reducing the circuit size of the image sensor system.

If the frequency of the clock signal CLKb supplied to each counter 23 is made higher than that of a clock signal CLKa supplied to the ramp generator 1b, higher-definition digital signals DIGI are obtainable.

As described above, the voltage generators according to the present invention, capable of keeping error in output voltage from increasing while achieving a reduction in circuit size, are applicable to liquid crystal displays, image sensor systems and the like.

What is claimed is:

1. A voltage generator comprising:
   a ladder resistor circuit for generating a plurality of different reference voltages;
   a plurality of switching circuits corresponding to a plurality of taps of the ladder resistor circuit, each of the plurality of switching circuits being connected at one end to a corresponding one of the taps and connected at the other end to an output node, and having a variable on-resistance value; and
   a control circuit for selecting continuous n (where n is any integer equal to or greater than 2) of the plurality of switching circuits, turning the n switching circuits on, and setting the respective on-resistance values of the n switching circuits.

2. The voltage generator of claim 1, wherein each of the plurality of switching circuits includes k switching elements connected in parallel between the corresponding one of the taps of the ladder resistor circuit and the output node; and
   the control circuit sets the on-resistance value of each of the n selected switching circuits by performing on/off control of each of the k switching elements included in that switching circuit.

3. The voltage generator of claim 1, wherein each of the plurality of switching circuits includes a transistor connected between the corresponding one of the taps of the ladder resistor circuit and the output node; and
   the control circuit sets the on-resistance value of each of the n selected switching circuits by controlling a gate voltage of the transistor included in that switching circuit.

4. The voltage generator of claim 1, wherein the control circuit receives a digital signal and selects the n switching circuits and sets the on-resistance values of the n switching circuits in accordance with a digital value of the digital signal so that an output voltage having a voltage value corresponding to that digital value is generated at the output node.

5. The voltage generator of claim 1, wherein the control circuit receives a first clock signal and selects the n switching circuits and sets the on-resistance values of the n switching circuits in accordance with the first clock signal so that an output voltage generated at the output node has a voltage value that gradually increases or decreases in synchronization with the first clock signal.

6. The voltage generator of claim 1, further comprising a variation reducing circuit connected to the output node to reduce voltage variation at the output node.

7. The voltage generator of claim 6, further comprising an amplifier circuit which is interposed between each of the plurality of switching circuits and the output node and whose input terminal is connected to the other end of each of the plurality of switching circuits and whose output terminal is connected to the output node.

8. The voltage generator of claim 1, further comprising a power source in which at least either voltage or current is variable,
   wherein the ladder resistor circuit receives an output from the power source to generate the plurality of reference voltages.

9. An analog-to-digital converter for converting an analog signal to a digital signal, comprising:
   the voltage generator of claim 5;
   a comparator for comparing a voltage value of the analog signal with the voltage value of the output voltage from the voltage generator; and
   a counter for counting up or down in synchronization with a second clock signal, receiving result of the comparison made by the comparator, and outputting, as the digital signal, a count value when relationship between the analog signal and the output voltage in terms of magnitude is reversed.

10. The analog-to-digital converter of claim 9, wherein the second clock signal has a higher frequency than the first clock signal.

11. An image sensor system comprising:
   the voltage generator of claim 5;
   an image sensor circuit including an imaging area and a plurality of processing sections, the imaging area including a plurality of imaging elements arranged in a matrix and each performing photoelectric conversion in which an object's image is converted to an electrical signal, the processing sections being provided for respective columns in the imaging area and each converting the electrical signal obtained by each imaging element belonging to one of the columns corresponding to that processing section to an analog signal and outputting the obtained analog signal;
   a plurality of comparators corresponding to the plurality of processing sections in the image sensor circuit and each comparing a voltage value of the analog signal output from a corresponding one of the plurality of processing sections with the voltage value of the output voltage from the voltage generator; and
   a plurality of counters corresponding to the plurality of comparators, each of the plurality of counters counting up or down in synchronization with a second clock signal, receiving result of the comparison made by a corresponding one of the plurality of comparators, and outputting, as a digital signal, a count value when relationship between the analog signal corresponding to that corresponding comparator and the output voltage in terms of magnitude is reversed.

12. The image sensor system of claim 11, wherein the second clock signal has a higher frequency than the first clock signal.

* * * * *